United States Patent
Reimann

(10) Patent No.: US 6,486,720 B2
(45) Date of Patent: Nov. 26, 2002

(54) FLIP-FLOP CIRCUIT ARRANGEMENT WITH INCREASED CUT-OFF FREQUENCY

(75) Inventor: Reinhard Reimann, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 09/925,904

(22) Filed: Aug. 9, 2001

(65) Prior Publication Data

US 2002/0024369 A1 Feb. 28, 2002

(30) Foreign Application Priority Data

Aug. 9, 2000 (DE) .......................... 100 38 905

(51) Int. Cl.[7] .............................................. H03K 3/037
(52) U.S. Cl. ....................................... 327/200; 327/201
(58) Field of Search ................................. 327/200, 266, 327/274, 280, 201, 203, 206, 208, 211, 356, 359

(56) References Cited

U.S. PATENT DOCUMENTS

| | | | |
|---|---|---|---|
| 4,777,388 A | | 10/1988 | Widener ..................... 327/202 |
| 5,434,523 A | * | 7/1995 | Sundstrom ................... 327/172 |
| 5,510,734 A | * | 4/1996 | Sone ........................... 327/203 |
| 5,877,642 A | * | 3/1999 | Takahashi ..................... 326/126 |
| 5,892,382 A | | 4/1999 | Ueda et al. ................... 327/202 |
| 6,218,878 B1 | * | 4/2001 | Ueno .......................... 327/202 |

FOREIGN PATENT DOCUMENTS

| | | | |
|---|---|---|---|
| EP | 0696851 | 2/1996 | ......... H03K/19/094 |
| GB | 1483028 | 8/1977 | ............ H03K/3/35 |
| JP | 62222712 | 9/1987 | .......... H03K/3/286 |
| JP | 63060623 | 3/1988 | .......... H03K/3/286 |
| JP | 10051279 | 2/1998 | .......... H03K/2/289 |
| JP | 10229328 | 8/1998 | .......... H03K/3/037 |
| JP | 10229329 | 8/1998 | .......... H03K/3/289 |
| JP | 10-270986 | * 9/1998 | |

OTHER PUBLICATIONS

"53 Ghz Static Frequency Divider in a Si/SiGe Bipolar Technology", Martin Wurzer et al.; ISSCC 2000./ Session 12/ Frequency Synthesizers and Dividers/ Paper TP 12.6; Digest of Technical Papers, Feb. 8, 2000, pp. 206, 207.

* cited by examiner

Primary Examiner—Timothy P. Callahan
Assistant Examiner—Linh Nguyen
(74) Attorney, Agent, or Firm—W. F. Fasse; W. G. Fasse

(57) ABSTRACT

In a flip-flop including a control element and a holding element, in which a first current causes the control element to set a logic state and a second current causes the holding element to maintain the logic state, the cut-off frequency is increased by dimensioning the transistors of the holding element to be smaller than the transistors of the control element. In other words the transistors of the holding element have a smaller current-carrying capacity than the transistors of the control element.

13 Claims, 1 Drawing Sheet

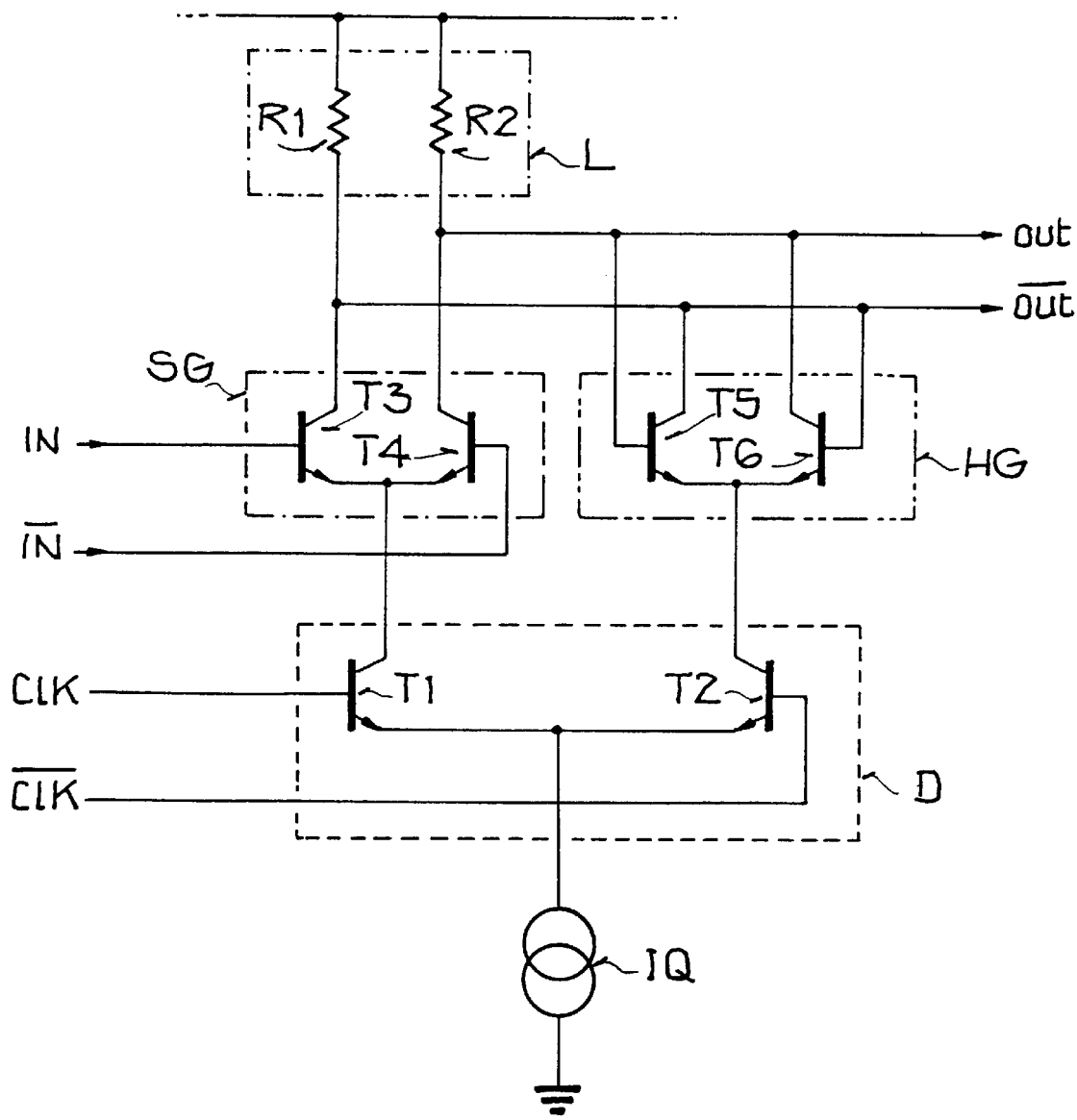

FLIP-FLOP CIRCUIT ARRANGEMENT WITH INCREASED CUT-OFF FREQUENCY

BACKGROUND

1. Field of the Invention

The invention relates to a method for increasing the cut-off frequency of flip-flops.

2. Description of the Related Technology

Circuits with flip-flops are used in the digital signal processing field for storing logic states. They consist internally of a control element, which takes the logic state which is applied to its input and makes it available for evaluation at its output, and of a holding element, which maintains the state which is set. Using a clock, inter alia, so-called frequency dividers or dividing stages can be assembled from a series connection of a plurality of flip-flops. The processing of increasingly higher frequencies requires dividing stages which operate at several gigahertz, especially in the GSM, ISM wireless communication field. Because of the development to higher frequencies, the transistors which are used in the flip-flops have to meet higher requirements in terms of the cut-off frequency thereof, which must be approximately twice the maximum frequency of the divider.

The transistor production process is becoming significantly more complex and cost-intensive due to the higher frequency requirements. The cut-off frequency of an individual flip-flop circuit results from the signal propagation time within the circuit. It is essentially determined by the product of the load resistance and the capacitance at the output line of the flip-flop and, considered quite generally, can be conceived as a low pass filter. With a given load resistance, the transistors of the circuit must be able to handle a sufficiently high current, according to the value of the capacitance which is to be recharged upon a change occurring in the logic state. If this is not the case, high-current effects will occur and the cut-off frequency of the flip-flop will drop drastically.

In the methods known from the prior art, for example in M. Wurzer et al., ISSCC 2000, San Francisco, the transistors which are used in the control elements and holding elements are dimensioned to prevent high-current effects following the maximum peak current values occurring in the control elements.

The disadvantage of the previous conventional method and circuit design lies in the fact that the different electrical requirements to be met by the control element and the holding element are not taken into account, and the transistor capacitances linked with the area are consequently not optimized. As these have to be recharged at the output lines of the flip-flop each time there is a change in the logic state, this has an adverse influence on the cut-off frequency of the flip-flop.

SUMMARY OF THE INVENTION

The present invention seeks to provide a method which increases the cut-off frequency of flip-flops and which can at the same time be implemented easily and inexpensively.

According to a first aspect, the present invention provides a method for increasing the cut-off frequency of a flip-flop including at least one control element having at least two transistors and at least one holding element having at least two transistors, said control element setting, by means of a first current, a logic state of said flip-flop, said logic state being maintained by said holding element by means of a second current, wherein the current carrying capacity of said transistors of said control element is adapted to the value of said first current, and the current carrying capacity of said transistors of said holding element is adapted to the value of said second current.

According to a second aspect, the present invention provides a flip-flop including at least one control element having at least two transistors and at least one holding element having at least two transistors, and means supplying a first current to said control element so that it sets a logic state of the flip-flop and a second current to said holding element so that it maintains said logic state, wherein said transistors of said holding element have smaller dimensions than said transistors of said control element.

BRIEF DESCRIPTION OF THE FIGURE

A preferred embodiment of the present invention will now be explained, by way of example only. The invention is explained in the following in connection with the drawing, in which the single FIGURE is a block diagram showing an embodiment of a flip-flop according to the invention.

DESCRIPTION OF THE PREFERRED EMBODIMENTS

Basically the present invention provides a method for increasing the cut-off frequency of a flip-flop which comprises at least one control element having at least two transistors and at least one holding element having at least two transistors, and the control element sets by means of a first current a logic state of the flip-flop which is maintained by the holding element by means of a second current, wherein the current carrying capacity of the transistors of the control element is adapted to the value of the first current, and the current carrying capacity of the transistors of the holding element is adapted to the value of the second current.

Methods according to embodiments of the invention relate to adapting the current carrying capacity of the transistors of a holding element in a flip flop separately from the current carrying capacity of a control element. The task of the control element is to transfer the logic state which is applied to an input to an output of the flip-flop by means of a first current.

If the logic state at the input changes, there will also be a change in the value of the first current at the output. It is of advantage if the current in this case produces via a load element a voltage drop which corresponds to the respective logic state. The task of the holding element is to maintain, by means of a second current, the logic state which has been set by the control element. If the logic state at the input of the control element corresponds to the state already existing at the output, then the two currents will be equal, i.e. the requirement in terms of the value of the current carrying capacity of the transistors of the control element and the transistors of the holding element will be equal in a static operating mode. If the logic state changes at the input, then the value of the first current must be changed by the control element. This means that the capacitances which are present at the output of the control element must be respectively charged and discharged by the transistors of the control element in a dynamic operating mode. An additional current is required for this recharging when compared with the static operating mode. In considering the dynamic operating mode, the current carrying capacity of the transistors of the control element must therefore be greater than the current carrying capacity of the transistors of the holding element.

As the value of the current carrying capacity in the transistors is proportional to the capacitance thereof, the contribution of the transistors to the capacitance at the output of the flip-flop is reduced when compared with the prior art, and the cut-off frequency is increased as a result.

The required current carrying capacity is preferably calculated by means of simulation of the circuit parts before the circuit is produced. The requirements in terms of current carrying capacity are in this case implemented by dimensioning the transistors during the layout phase, preferably by means of scaling the area of the transistor types which are used for a flip-flop circuit arrangement. According to the dynamic operating requirements, the transistors of the holding element have smaller dimensions than the transistors of the control element. As the specific transistor capacitances are proportional to the transistor area, the reduction in the transistor area results in a reduction in the capacitance with respect to the prior art. A further advantage lies in the fact that the chip area can be reduced when producing an integrated flip-flop circuit arrangement by means of a smaller transistor area.

Referring to the drawings, the task of the flip-flop circuit arrangement which is illustrated in the single FIGURE is to store the digital state which is applied to an input IN, $\overline{IN}$ and make this state available at an output, OUT, $\overline{OUT}$ for further processing.

For this purpose the flip-flop comprises a current source IQ, which lies between a reference potential and a clock element D. The clock element D is also connected to a control element SG and a holding element HG and comprises an input CLK and a complementary input $\overline{CLK}$. In addition to the input IN and the complementary input $\overline{IN}$, the control element SG also comprises the output OUT and the complementary output $\overline{OUT}$. Each of the two outputs OUT and $\overline{OUT}$ is separately connected via a resistor R1 and a resistor R2 of a load element L to a supply potential and to a first terminal and a second terminal of the holding element HG.

In the illustrated embodiment the clock element D comprises a first transistor T1 and a second transistor T2, the emitters of which are jointly connected to the current source IQ. The base of the transistor T1 is connected to the input CLK and the base of the transistor T2 to the input $\overline{CLK}$. The collector of the transistor T1 is also connected to the two emitters of a first transistor T3 and a second transistor T4 of the control element SG. The collector of the transistor T2 is accordingly connected to the two emitters of a transistor T5 and a transistor T6 of the holding element HG. In the control element SG the base of the transistor T3 is connected to the input IN and the base of the transistor T4 to the input $\overline{IN}$, while the collector of the transistor T3 is connected to the output $\overline{OUT}$ and the collector of the transistor T4 to the output OUT. In the holding element HG the base of the transistor T5 and the collector of the transistor T6 are connected to the output line OUT and the base of the transistor T6 and the collector of the transistor T5 jointly to the output line $\overline{OUT}$.

The clock element D forms the starting point for the functional description. This clock element D decouples the current source IQ from the control element SG and the holding element HG. If the input CLK is at "low", the entire current will flow through the holding element HG, as the input $\overline{CLK}$ is at "high".

The entire current accordingly flows through the control element SG while the input CLK is "high". Because of the "high" potential at the input CLK, the control element SG becomes transparent, i.e. the respective logic state which is applied to the input IN is reproduced inverted on the output line $\overline{OUT}$ through a voltage drop at the load element L. If there is a change in potential from "high" to "low" at the input CLK, the holding element HG will take the logic stage which is set by the control element SG.

As the current of the current source IQ flows either entirely through one of the transistors T3 and T4 of the control element SG or entirely through one of the transistors T5 and T6 of the holding element HG in the static mode of operation, the four transistors T3 to T6 must have the same current carrying capacity for the static mode. In contrast, a change of potential to be carried out by the transistors T3 and T4 of the control element SG at the outputs OUT and $\overline{OUT}$ can only be described by means of a dynamic mode of observation. According to the change in direction of the logic stage, either the transistor T3 or the transistor T4 must for this purpose recharge the respective capacitance at the output lines OUT and $\overline{OUT}$, while the transistors T5 and T6 of the holding element HG do not bring about any change and are therefore to be considered as purely static. However the geometry of the transistors T3 and T4 must therefore be enlarged in order to handle the current peaks which occur upon changing the logic stage and are proportional to the value of the capacitance present at the output lines OUT and $\overline{OUT}$. In this case the respective capacitance consists of the capacitances of the conductor tracks, the capacitance of the load resistor L, the internal junction capacitances of the transistor T3 to T6, as well as the input capacitance of the follower stage connected to the output line OUT or the output line $\overline{OUT}$. If only the transistors T3 and T4 of the control element SG are enlarged in order to fulfill the dynamic requirements, the additional contribution to the internal transistor capacitances will be reduced to half with respect to the prior art. As the signal propagation time through the flip-flop is proportional to the product of the total capacitance and the value of the load resistor L, the cut-off frequency of the flip-flop will therefore increase or, at a predetermined frequency, the current consumption of the flip-flop will decrease with respect to the prior art.

Tests carried out by the applicants produced an increase in the cut-off frequency in a flip-flop circuit in the range of 10%. In terms of dividing stages operating, for example, in the range of 5 GHz, the result is an increase in cut-off frequency of 500 MHz. Here the transistors which have a higher internal specific transistor capacitance also exhibit a greater increase in cut-off frequency.

Thus, in summary, whereas in known methods, the area of the transistors is determined in a flip-flop circuit according to the current peaks at the control elements and this area is applied to the transistors of the holding element, according to the present method the area of the transistors of the holding element is adapted to their static current load. As the static current load is smaller than the dynamic current load of the transistors of the control element, the area of the transistors of the holding element is reduced. The total capacitance, which is to be recharged by the transistors of the control element upon a change occurring in the logic state, is therefore reduced. The cut-off frequency of the flip-flop circuit is increased accordingly.

It will be understood that the above description of the present invention is susceptible to various modifications, changes and adaptations.

What is claimed is:

1. A flip-flop including at least one control element having at least two transistors and at least one holding element having at least two transistors, and means for supplying a first current to said control element so that it sets a logic state of the flip-flop and a second current to said holding element so that it maintains said logic state, wherein said transistors of said holding element have smaller dimensions and a smaller current-carrying capacity than said transistors of said control element.

2. A digital flip-flop circuit comprising:

two input lines and two output lines;

a control element including two first transistors connected respectively to said two input lines and configured to set a digital logic output state present on said two output lines responsive to a digital input state provided on said two input lines; and a holding element including two second transistors connected to said two output lines and configured to hold said digital logic output state present on said two output lines;

wherein said second transistors of said holding element each respectively have a smaller current-carrying capacity than said first transistors of said control element.

3. The digital flip-flop circuit according to claim 2, further comprising a current source providing an electrical current, and a digital clock element interposed and connected between said current source and a respective emitter of each one of said first and second transistors.

4. The digital flip-flop circuit according to claim 3, wherein said digital clock element comprises first and second clock input lines, a first switching transistor connected to said first clock input line and interposed and connected between said emitters of said first transistors of said control element and said current source, and a second switching transistor connected to said second clock input line and interposed and connected between said emitters of said second transistors of said holding element and said current source, and wherein said first and second switching transistors are arranged and configured to operate in opposition to one another responsive to and dependent on opposite digital clock input signals provided respectively on said first and second clock input lines so that said electrical current of said current source is switched to flow either entirely through said control element or entirely through said holding element.

5. The digital flip-flop circuit according to claim 4, wherein said first transistors of said control element are connected respectively to said two input lines so as to operate in opposition to one another responsive to and dependent on said digital input state provided on said two input lines so that said electrical current of said current source is switched to flow entirely through either one or the other of said first transistors when said first and second switching transistors of said digital clock element are switched so that said electrical current flows through said control element, and wherein said second transistors of said holding element are connected so as to operate in opposition to one another responsive to said digital logic output state on said two output lines so that said electrical current of said current source is switched to flow entirely through either one or the other of said second transistors when said first and second switching transistors of said digital clock element are switched so that said electrical current flows through said holding element.

6. The digital flip-flop circuit according to claim 5, wherein said first transistors of said control element each have a current-carrying capacity that is greater than said electrical current of said current source in a steady state condition.

7. The digital flip-flop circuit according to claim 6, wherein said current-carrying capacity of each one of said first transistors is proportional to said electrical current of said current source in said steady state condition plus a charging current necessary for recharging an output capacitance on said output lines of said flip-flop circuit in a dynamic condition when said control element inverts said digital logic output state on said two output lines.

8. The digital flip-flop circuit according to claim 3, wherein said first transistors of said control element each have a current-carrying capacity that is greater than said electrical current of said current source in a steady state condition.

9. The digital flip-flop circuit according to claim 8, wherein said current-carrying capacity of each one of said first transistors is proportional to said electrical current of said current source in said steady state condition plus a charging current necessary for recharging an output capacitance on said output lines of said flip-flop circuit in a dynamic condition when said control element inverts said digital logic output state on said two output lines.

10. The digital flip-flop circuit according to claim 2, further comprising a current source connected to said first and second transistors so that an entire electrical current of said current source will flow entirely through a respective single one of said first and second transistors at any respective given time in a steady state condition.

11. The digital flip-flop circuit according to claim 10, wherein said second transistors each have a current-carrying capacity selected to handle the entire electrical current of said current source in said steady state operation.

12. The digital flip-flop circuit according to claim 2, wherein said second transistors of said holding element each respectively have smaller physical dimensions than said first transistors of said control element.

13. A method of designing said digital flip-flop circuit according to claim 8, comprising the following steps:

a) designing the current-carrying capacity of each one of said second transistors of said holding element to handle an entire magnitude of said electrical current of said current source in a steady state condition; and b) designing the current-carrying capacity of each one of said first transistors of said control element to be greater than the current-carrying capacity of each one of said second transistors and proportional to the entire magnitude of said electrical current of said current source in said steady state condition plus a charging current necessary for recharging an output capacitance on said output lines of said flip-flop circuit in a dynamic condition when said control element inverts said digital logic output state on said two output lines.

* * * * *